United States Patent
Higashi

(10) Patent No.: US 8,291,361 B2
(45) Date of Patent: Oct. 16, 2012

(54) SYSTEM AND METHOD FOR SUPPORTING LAYOUT DESIGN OF SEMICONDUCTOR INTEGRATED CIRCUIT

(75) Inventor: Kazunori Higashi, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 402 days.

(21) Appl. No.: 12/585,121

(22) Filed: Sep. 3, 2009

(65) Prior Publication Data

US 2010/0064272 A1     Mar. 11, 2010

(30) Foreign Application Priority Data

Sep. 9, 2008   (JP) ................................. 2008-230763

(51) Int. Cl.
    *G06F 17/50*     (2006.01)
(52) U.S. Cl. ......... 716/104; 716/101; 716/126; 716/132
(58) Field of Classification Search ................... 716/101, 716/104, 126, 132
    See application file for complete search history.

(56) References Cited

U.S. PATENT DOCUMENTS

| | | | |
|---|---|---|---|
| 6,978,431 B2 | 12/2005 | Hirakimoto et al. | |
| 6,988,254 B2 | 1/2006 | Iwanishi et al. | |
| 7,245,516 B2 | 7/2007 | Inoue | |
| 7,334,210 B2 | 2/2008 | Matsumura et al. | |
| 7,603,641 B2 * | 10/2009 | Lin | 716/120 |
| 2005/0097492 A1 | 5/2005 | Matsumura et al. | |
| 2007/0033565 A1 | 2/2007 | Ohyabu et al. | |
| 2008/0141202 A1 | 6/2008 | Matsumura et al. | |

FOREIGN PATENT DOCUMENTS

| | | |
|---|---|---|
| JP | 10-242283 (A) | 9/1998 |
| JP | 2004-070721 (A) | 3/2004 |
| JP | 2005-142226 A | 6/2005 |
| JP | 2007-41774 A | 2/2007 |
| JP | 2007-95811 A | 4/2007 |
| JP | 2007-142282 (A) | 6/2007 |
| KR | 10-2004-0023488 A | 3/2004 |

OTHER PUBLICATIONS

Korean Office Action dated Feb. 14, 2011, with Japanese and partial English translations.
Notification of Reasons for Refusal dated Jul. 9, 2012, with partial English-language translation.

* cited by examiner

*Primary Examiner* — Thuan Do

(74) *Attorney, Agent, or Firm* — McGinn IP Law Group, PLLC

(57) ABSTRACT

In a layout design method of a semiconductor integrated circuit, an IR drop data is calculated to indicate a voltage drop for every local area, and a virtual arrangement library is generated which stores data of a circuit cell to be arranged based on the IR drop data for every circuit module. A virtual arrangement net list is generated by converting the circuit cell contained in a net list into a virtual arrangement cell which is registered on the virtual arrangement library. The circuit module is automatically arranged based on the virtual arrangement net list; and the virtual arrangement cell contained in the automatically arranged circuit module is replaced with the circuit cell contained in the net list.

27 Claims, 24 Drawing Sheets

Fig. 4

| MODULE A | 200mW |
| MODULE B | 300mW |
| MODULE C | 150mW |
| MODULE D | 100mW |
| ⋮ | |

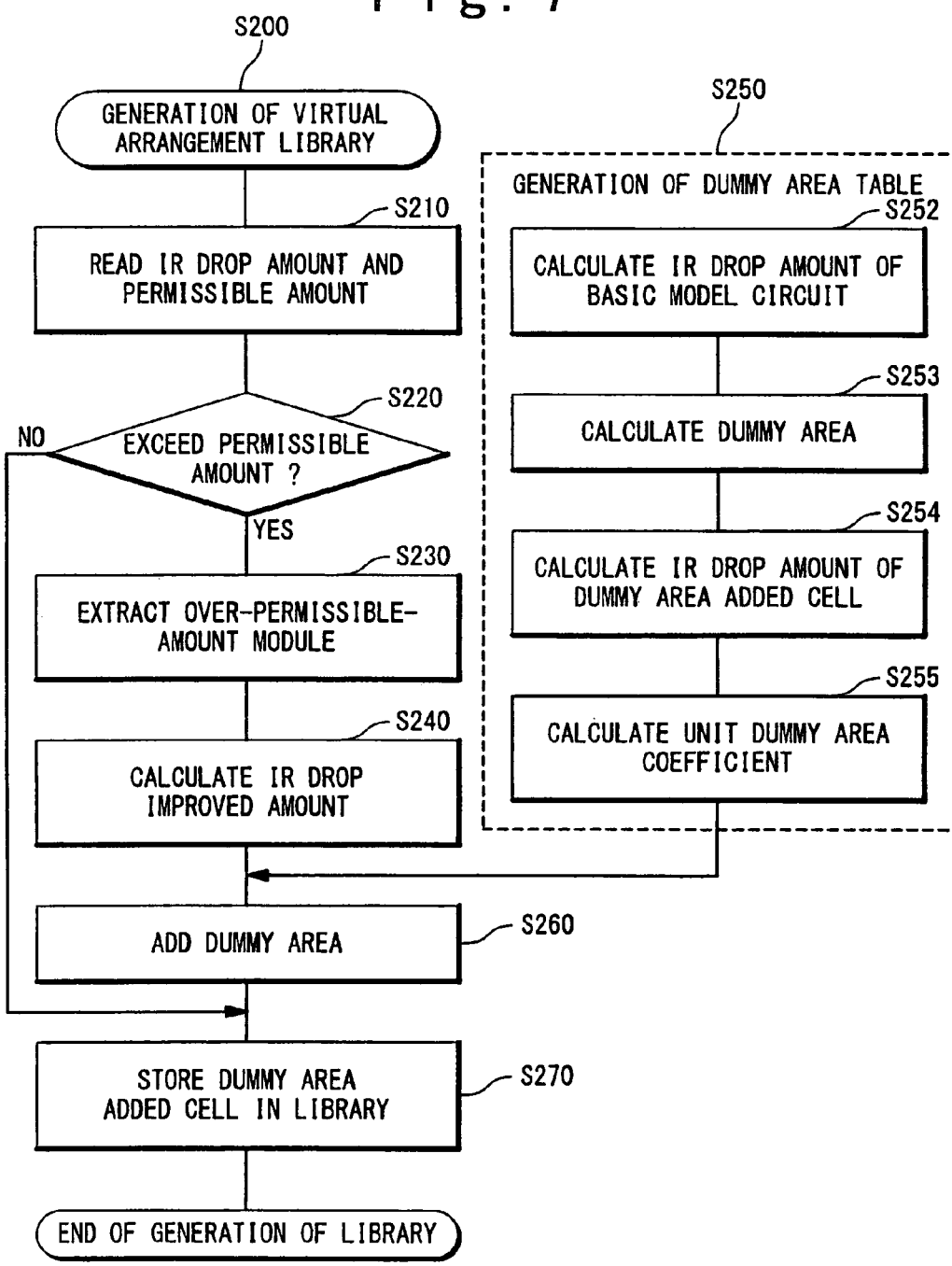

Fig. 11

|  | | CLOCK PERIOD | | | | |
|---|---|---|---|---|---|---|
|  | | 1ns | 2ns | 3ns | 4ns | 5ns |
| DROP IMPROVED AMOUNT OF MODULE | 10mV | 15 | 9 | 7 | 6 | 5 |
| | 20mV | 22 | 17 | 15 | 13 | 11 |
| | 30mV | 34 | 27 | 23 | 20 | 18 |

(UNIT: GRID)

DUMMY AREA (NUMBER OF GRIDS INCREASED FROM ORIGINAL CELL)

SYSTEM AND METHOD FOR SUPPORTING LAYOUT DESIGN OF SEMICONDUCTOR INTEGRATED CIRCUIT

INCORPORATION BY REFERENCE

This patent application claims a priority on convention based on Japanese Patent Application No. 2008-230763. The disclosure thereof is incorporated herein by reference.

BACKGROUND OF THE INVENTION

1. Field of the Invention

The present invention relates to a system and method for supporting layout design of semiconductor integrated circuit.

2. Description of Related Art

Finer processes of a semiconductor device have advanced, and the thickness of a gate oxide film of a transistor becomes thinner so that a power supply voltage is lowered. In order to perform the adjustment of a delay variation and timing constraint due to a voltage drop (IR drop) in a power supply interconnection under a low power supply voltage, a process of the arrangement and wiring in a layout design, and a process of confirming a permissible amount of the IR drop need to be performed repeatedly, which makes the timing convergence difficult. Moreover, a malfunction might arise if a voltage drop in the entire LSI due to the IR drop is too large. Therefore, a design technique is desired which a voltage amount of an IR drop at any point (hereinafter to be referred to as an IR drop amount) is determined to a voltage at a reference point from an initial stage of design and the arrangement density restriction is performed based on the IR drop amount.

The Japanese Patent Application Publication (JP-P2007-95811A) discloses a technique as a design method based on an IR drop amount. In this method of designing a semiconductor integrated circuit, a power supply model to be analyzed is at first selected within a range of obtainable data. Next, by presupposing an initial arrangement at a chip level or lower module level of the selected power supply model, data on the tendency of the voltage drop is produced. Then, based on the produced data on the tendency of the voltage drop, an arrangement density distribution of cells and transistors is produced in accordance with the tendency of voltage trop that is estimated at an initial stage of the design of a semiconductor integrated circuit. Moreover, the produced arrangement density distribution is converted into a design data. Thus, the semiconductor integrated circuit can be designed in which the influence of the voltage drop is suppressed.

An arrangement algorithm of the arrangement tool, however, emphasizes timings at the time of the operation. Therefore, even if an arrangement constraint condition is set and the arrangement tool is performed, the cell arrangement result may not satisfy the arrangement constraint condition. Therefore, the IR drop amount is not reflected on the cell arrangement. Thus, a process of arrangement and wiring and a process of confirming a permissible amount of the IR drop are iteratively executed so as to satisfy the permissible amount of the IR drop.

Further, Japanese Patent Application Publication (JP-P2007-41774A) discloses a layout method for a basic cell. The basic cell is one of a plurality of basic cells previously prepared, and is provided with one or more logic cells. The basic cell is also provided with one or more capacitive cells between a power supply interconnection and a grand interconnection which are connected to the logic cell. A semiconductor integrated circuit is designed by combining the plurality of basic cells. The layout method for the basic cell includes a process of arranging the basic cell, a process of calculating an interconnection density, and a process of changing the basic cell, in a process of performing a layout of the basic cell. In the process of arranging the basic cell, the basic cell is arranged. In the process of calculating the interconnection density, the interconnection density is calculated from the result of the arrangement of the basic cell. In the process of changing the basic cell, the basic cell is changed to a basic cell having an input/output terminal at a different position based on the interconnection density. That is, in this method, a capacitive cell is arranged in the vicinity of the basic cell to relief of the IR drop amount, and analysis of the IR drop is performed after the logic synthesis or the layout arrangement, and then the capacitive cell is replaced with the basic cell.

Another method for designing a cell-based semiconductor integrated circuit is disclosed in Japanese Patent Application Publication (JP-P2005-142226A).

SUMMARY OF THE INVENTION

The present invention provides a layout design supporting method for a semiconductor integrated circuit and a layout design supporting system which can suppress and control an IR drop amount within a permissible range without depending on an arrangement tool.

In an aspect of the present invention, a layout design method of a semiconductor integrated circuit is achieved by calculating an IR drop data indicating a voltage drop for every local area; by producing a virtual arrangement library which stores data of a circuit cell to be arranged based on the IR drop data for every circuit module; by generating a virtual arrangement net list by converting the circuit cell contained in a net list into a virtual arrangement cell which is registered on the virtual arrangement library; by automatically arranging the circuit module based on the virtual arrangement net list; and by replacing the virtual arrangement cell contained in the automatically arranged circuit module with the circuit cell contained in the net list.

In another aspect of the present invention, a computer-readable recording medium in which a computer-executable program code is stored to cause a computer to attain the layout design method.

It is still another aspect of the present invention, layout design supporting apparatus for a semiconductor integrated circuit, includes an IR drop data calculating section configured to calculate an IR drop data indicating a voltage drop for every local area; a virtual arrangement library generating section configured to generate a virtual arrangement library which stores data of a circuit cell to be arranged based on the IR drop data, for every circuit module; a net list converting section configured to change the circuit cell contained in a net list into a virtual arrangement cell registered on the virtual arrangement library and generate an virtual arrangement net list; an automatically arranging section configured to automatically arrange the circuit module based on the virtual arrangement net list; and a net list reversely converting section configured to replace the virtual arrangement cell contained in the automatically arranged circuit module with the circuit cell contained in the net list.

According to the present invention, it can be provided a layout design supporting method for a semiconductor integrated circuit and a layout design supporting system which can suppress and control an IR drop amount within an acceptable range without depending on an arrangement tool.

BRIEF DESCRIPTION OF DRAWINGS

The above and other objects, advantages and features of the present invention will be more apparent from the following description of certain embodiments taken in conjunction with the accompanying drawings, in which:

FIG. 4 shows an example of power consumption amount data for each module according to the first embodiment of the present invention;

FIG. 7 is a diagram showing a procedure to generate a virtual arrangement library according to the first embodiment of the present invention;

FIG. 11 shows an example of a dummy area table according to the first embodiment of the present invention;

DESCRIPTION OF THE PREFERRED EMBODIMENTS

Hereinafter, a layout design supporting system according to the present invention will be described with reference to the attached drawings.

First Embodiment

Figure 1:
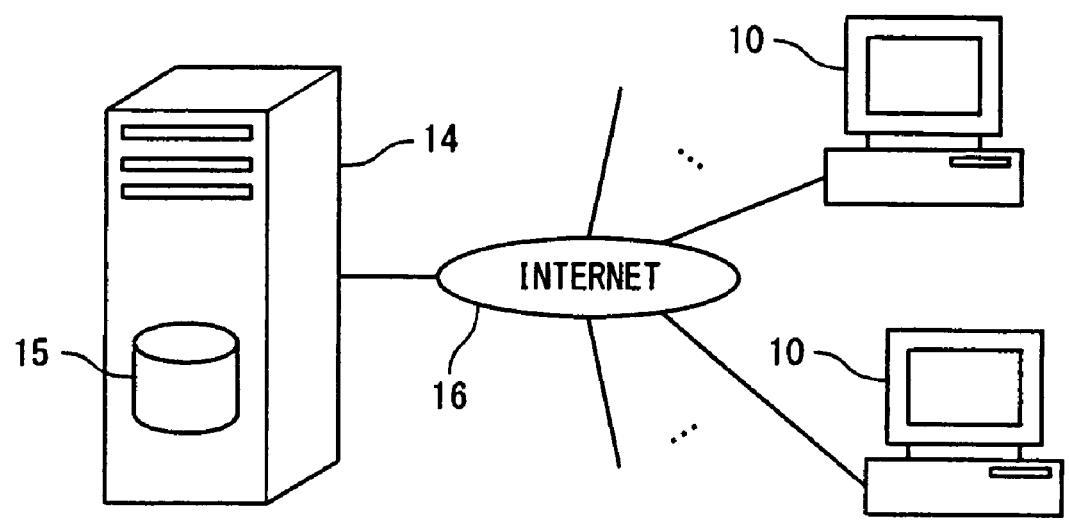
FIG. 1 shows a configuration of a layout design supporting system according to the present invention.

FIG. 1 is a block diagram showing a configuration of the layout design supporting system for a semiconductor integrated circuit according to a first embodiment of the present invention. The layout design supporting system is provided with a computer 10 and a server 14, which are connected with each other via a network 16. The computer 10 is an information processing apparatus exemplified by an engineering workstation (EWS). The server 14 is provided with a storage unit 15 for storing a layout design program executed on the computer 10 and data of a layout design. The server 14 supplies the layout design program, model equations and model parameters to the computer 10. The present embodiment will be described in which the serve 14 stores the layout design program and the data of the layout design, the computer 10 executes the layout design program, and the server 14 and the computer 10 are connected with each other via the network 16. However, a single computer may store the layout design program and the data of the layout design.

The layout design program, the model equations and the model parameters stored in the storage unit 15 are downloaded from the server 14 into the computer 10 via the network 16. The downloaded model equations and model parameters are stored in a local hard disc unit or a memory in the computer 10 and used for layout design.

Figure 2:
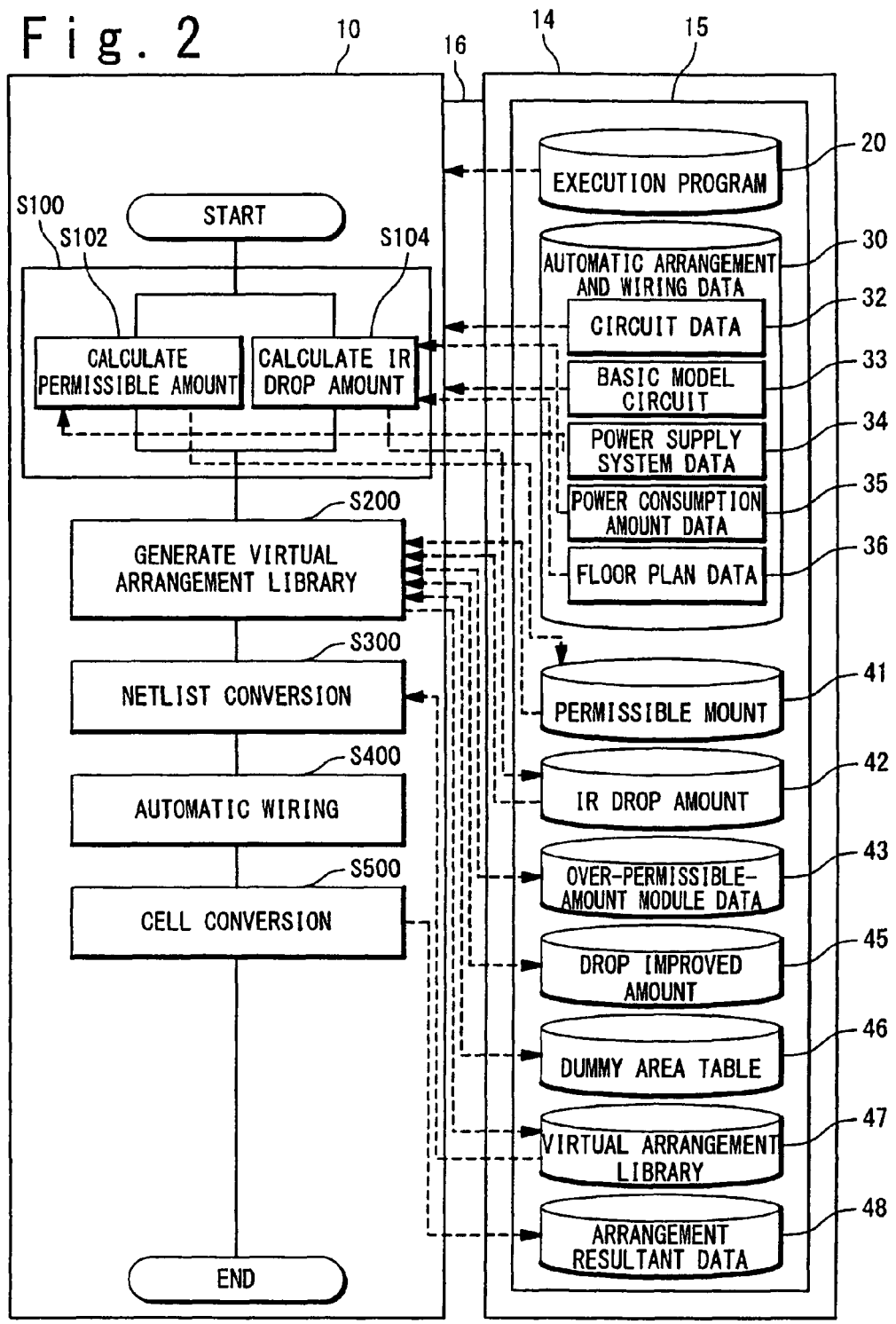
FIG. 2 is a diagram showing a configuration and operation of the layout design supporting system according to the first embodiment of the present invention.

As shown in FIG. 2, the storage unit 15 of the server 14 stores a layout design program 20 and automatic arrangement and wiring data 30. The automatic arrangement and wiring data 30 contains circuit data 32 including a netlist, module data, clock data, and operation frequency data, basic model circuit data 33, power supply system data 34 including data of power supply configuration, a power supply structure, and interconnection resistances and interconnection capacitances of power supply interconnections, power consumption amount data 35, and floor plan data 36.

Furthermore, the storage unit 15 stores IR drop amounts 42 calculated by the computer 10, permissible amounts 41, overpermissible-amount module data 43, a drop improved amount 45, a dummy area table 46, a virtual arrangement library 47, and arrangement resultant data 48. The IR drop amount 42 is an IR drop amount calculated in association with a position in a chip. The permissible amount 41 is a permissible amount calculated in association with a position in the chip. The over-permissible-amount module data 43 is data indicating a module arranged in a position where the IR drop amount exceeds the permissible amount. The drop improved amount 45 indicates an improved amount of IR drop that requires to be improved, and is calculated for each module. The dummy area table 46 is data on a dummy area previously calculated in relation to a cell. The virtual arrangement library 47 indicates a cell group for virtual arrangement, in which a dummy area is added to each module. The arrangement resultant data 48 is an arrangement result of the layout design.

Referring to FIG. 2, an operation of the layout design supporting system of a semiconductor integrated circuit according to the first embodiment of the present invention will be described. The design method of the present invention will be described briefly. First, IR drop data is produced based on the automatic arrangement and wiring data 30 (step S100). Based on the IR drop data, a virtual arrangement cell is produced in which a dummy area is added, to satisfy the permissible amount, and then registered as the virtual arrangement library 47 (step S200). A cell registered in a netlist is converted into the virtual arrangement cell registered in the virtual arrangement library 47 (step S300). The automatic wiring is performed by use of the virtual arrangement cell (step S400), and the virtual arrangement cell is converted into an original cell (step S500) to complete the cell arrangement. Thus, it is possible to realize a layout that satisfies the permissible amount of the IR drop.

The detailed description will be made below. When implementing the layout design, the layout design program 20 and the automatic arrangement and wiring data 30 are downloaded to the computer 10 via the network 16. The automatic arrangement and wiring data 30 contains the circuit data 32 including a netlist, module data, clock data, and operation frequency data, the power supply system data 34 including a power supply configuration, a power supply structure, and wiring resistances and wiring capacitances of power supply wirings, the floor plan data 36, the basic model circuit data 33, and the power consumption amount data 35.

First, IR drop data of an LSI for the layout design is produced based on the downloaded automatic arrangement and wiring data 30 (step S100). The IR drop data includes a permissible amount and an IR drop amount in various locations on the LSI.

At step S100, the permissible amount is calculated based on the power supply system data 34 including a power supply structure, the number of the power supplies, and the wiring resistances and the interconnection capacitances of the power supply interconnections (step S102). The permissible amount is calculated as the IR drop amount occurred when the cells are distributed evenly over the entire LSI. That is, an ideal IR drop amount is the IR drop amount when the cells are distributed evenly over the entire LSI, which is defined as the permissible amount at that position. The layout design supporting system of the present invention arranges the cells for each module so as to fall within a permissible range of the IR drop. The calculated permissible amount 41 is stored in the storage unit 15 via the network 16.

Figure 3A:
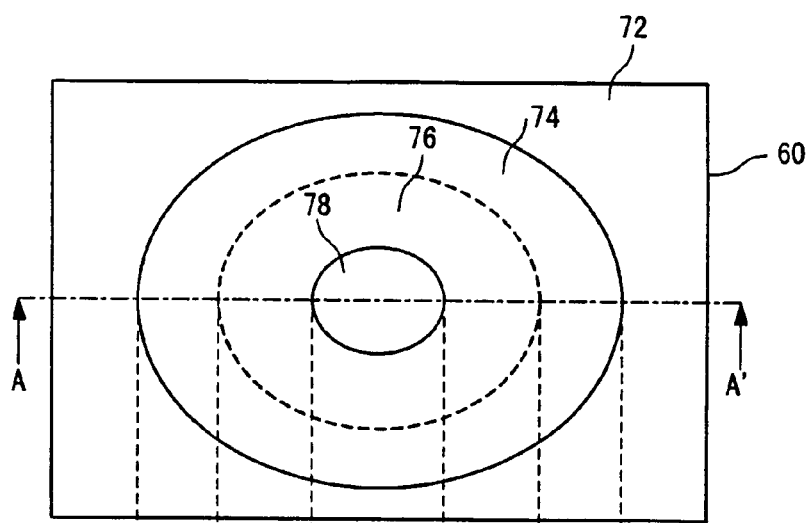
FIG. 3A is a schematic diagram showing a distribution of permissible amounts of IR drop in an LSI according to the first embodiment of the present invention.
Figure 3B:
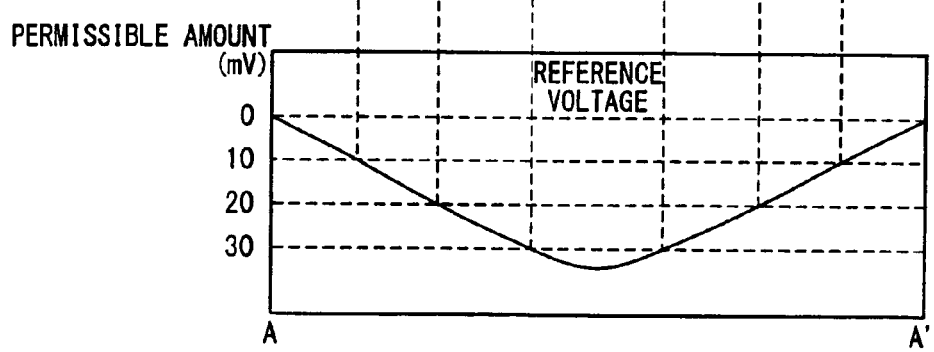
FIG. 3B is a diagram showing the permissible amount on a line AA' shown in FIG. 3A.

FIG. 3A is a schematic diagram showing a distribution of the permissible amounts. When the cells are evenly arranged on the LSI 60, the IR drop amount increases concentrically toward the center of the LSI 60, and reaches a maximum amount at the center of the LSI 60. Here, in the cells evenly arranged, the IR drop hardly generates in a peripheral region 72 of the LSI 60, so that it is calculated that the IR drop amount in the internal region 74 is 20 mV or less, the IR drop amount in a region 76 further inside thereof is 30 mV or less, and the IR drop amount at the central region 78 is 30 mV or more. The IR drop amount in each location on the LSI on which the cells are evenly arranged is the permissible amount at that position. In addition, FIG. 3B shows the permissible amount on a line AA' shown in FIG. 3A, which reveals that the permissible amount increases toward the center with respect to a reference value (the power supply voltage, the voltage drop 0 volt) indicated by a dashed line.

Also, at step S100, the IR drop amount is calculated based on the power consumption amount data 35 for each module and the floor plan data 36 (step S104). The IR drop amount 42 to be calculated includes an IR drop amount for each module and the IR drop amount of the entire LSI. The calculated IR drop amount 42 is stored in the storage unit 15 via the network 16.

Figure 5:
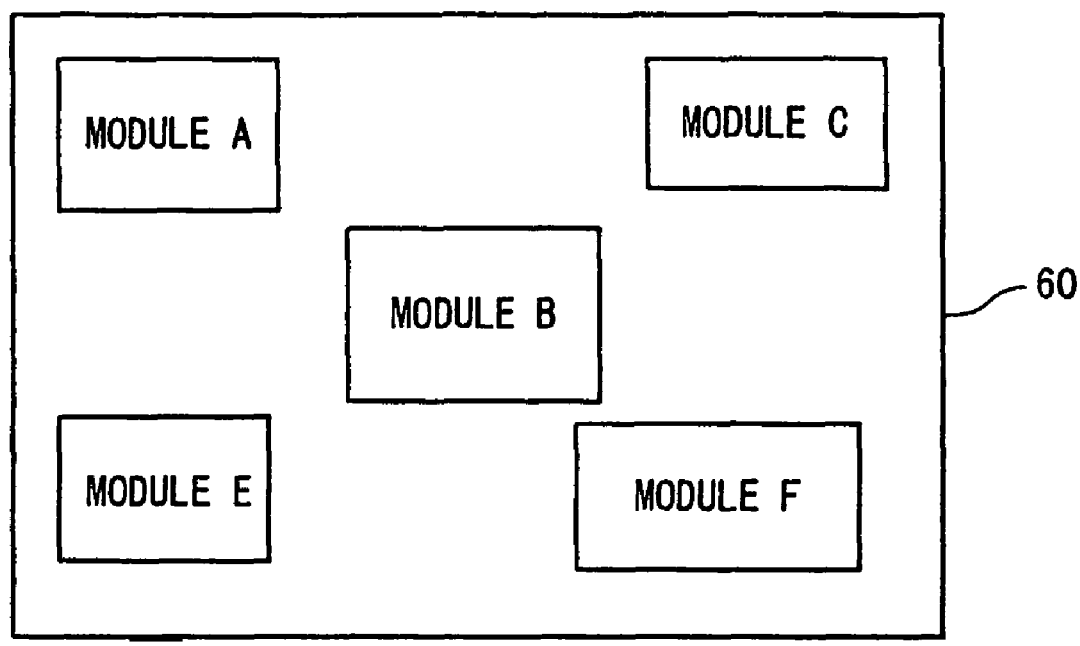
FIG. 5 is a diagram showing an example of floor plan data according to the first embodiment of the present invention.
Figure 6:
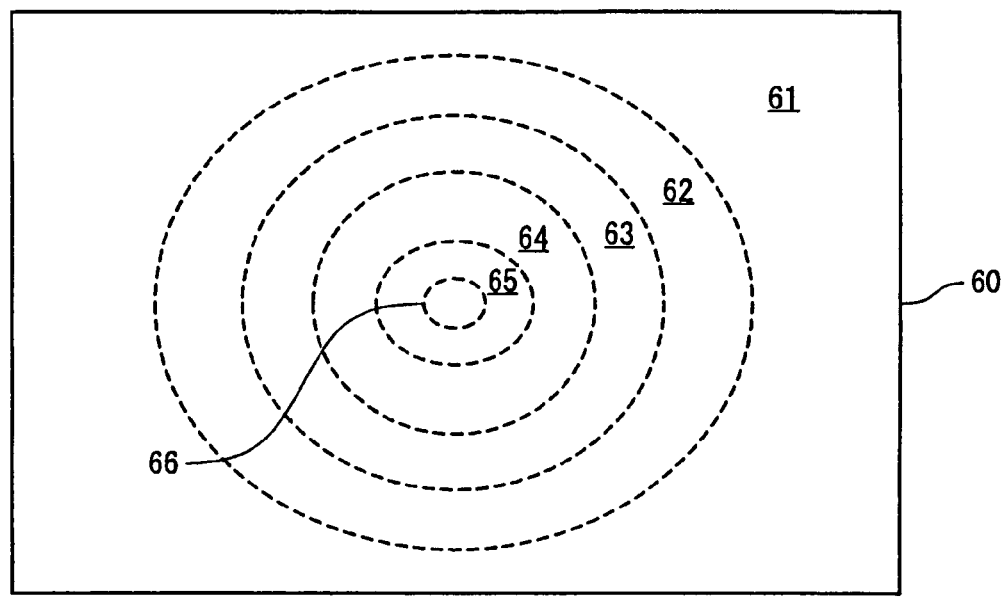
FIG. 6 is a diagram showing an example of a distribution of IR drop amounts according to the first embodiment of the present invention.

As shown in FIG. 4, the power consumption amount data 35 contains a power consumption amount for each module. Here, the power consumption amount is 200 mW in case of a module A, 300 mW in case of a module B, 150 mW in case of a module C, and 100 mW in case of a module E. Further, as shown in FIG. 5, the floor plan data 36 contains data on modules A, B, C, E and F arranged on the LSI 60. Here, it is illustrated that the modules A, C, E and F are arranged on four corners of the LSI 60, and the module B is arranged at the center of the LSI 60. The IR drop amounts 42 are calculated based on the power consumption amount data 35 and the floor plan data 36, as shown in FIG. 6. A calculation result reveals that the IR drop hardly occurs in a peripheral region 61 of the LSI 60 and increases toward the center. Here, a calculation result reveals that the IR drops occurs, toward the center, such as 10 to 20 mV in a region 62, 20 to 30 mV in a region 63, 30 to 40 mV in a region 64, 40 to 50 mV in a region 65, and 50 to 60 mV in a central region 66.

When the IR drop data is calculated, a virtual arrangement library 47 is produced by referring to the calculated permissible amount 41 and the IR drop amount 42 (step S200). The cells registered in the virtual arrangement library 47 are cells in the netlist contained in the circuit data 32 which has been provided at an initial stage of the design (hereinafter to be referred to as original cells), and dummy area added cells that are the original cells with dummy areas added thereto.

As shown in FIG. 7, in the process of producing the virtual arrangement library (step S200), the IR drop amount and the permissible amount of each location are firstly received (step S210). According to the present invention, a cell included in a module arranged in a position where the IR drop amount 42 exceeds the permissible amount 41 is replaced with the a dummy area added cell. Therefore, in order to extract the module to be replaced with the dummy area added cell, it is determined whether there is any position where the IR drop amount exceeds the permissible amount (step S220). If there is no position where the IR drop amount exceeds the permissible amount (step S220-NO), the automatic arrangement and wiring process is executed based on a cell being used normally. If there is a position where the IR drop amount exceeds the permissible amount (step S220-YES), a module located at that position (the over-permissible-amount module) is extracted (step S230).

Figure 8A:
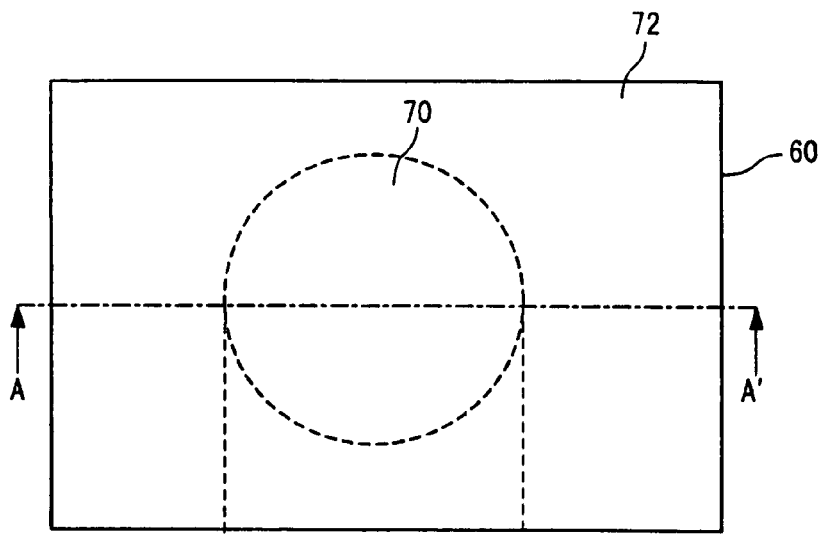
FIG. 8A is a diagram showing an area where the IR drop amount exceeds the permissible amount according to the first embodiment of the present invention.
Figure 8B:
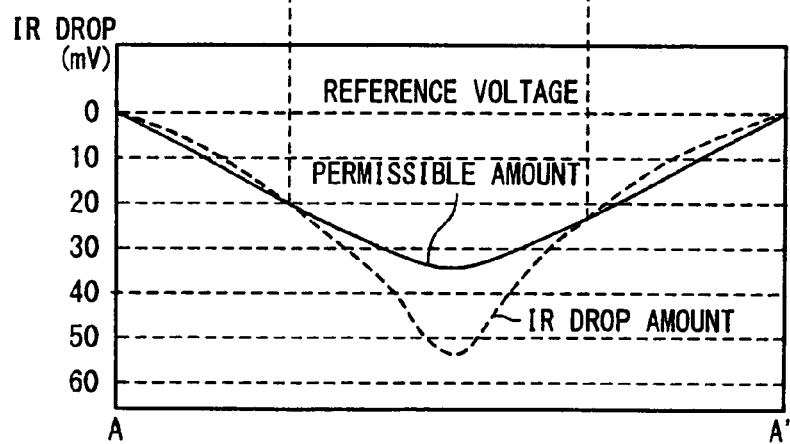
FIG. 8B is a diagram showing the permissible amount on a line AA' shown in FIG. 8A.
Figure 9:
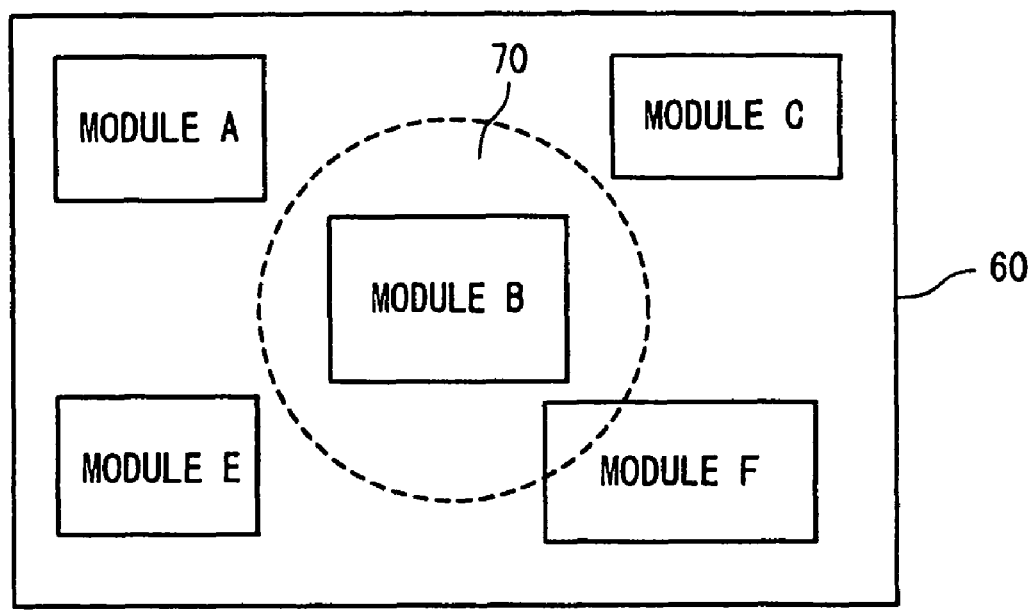
FIG. 9 is a diagram showing position relation of the modules exceeding the permissible amount according to the first embodiment of the present invention.

It is hereby assumed that, in the LSI 60 in which the permissible amount is distributed as shown in FIG. 3 and the five modules are arranged as shown in FIG. 5, the IR drop amount is distributed as shown in FIG. 6. In this case, a region 70 is detected where the IR drop amount exceeds the permissible amount, as shown in FIGS. 8A and 8B. A module with regard to the region 70 is thus extracted based on the layout data, as shown in FIG. 9. Here, a module B and a module F are extracted as the over-permissible-amount modules. The data on the extracted over-permissible-amount module is stored in the storage unit 15 via the network 16 as the modules over-permissible-amount module data 43.

When the over-permissible-amount module is extracted, the drop improved amount is calculated for the module (step S240). A part of the IR drop amount exceeding the permissible amount is calculated as the IR drop improved amount in the over-permissible-amount module data. That is, this means that reduction of the IR drop for the drop improved amount keeps the over-permissible-amount module within the permissible amount. The calculated drop improved amount 45 is stored in the storage unit 15 via the network 16 in association with the module.

Figure 10A:
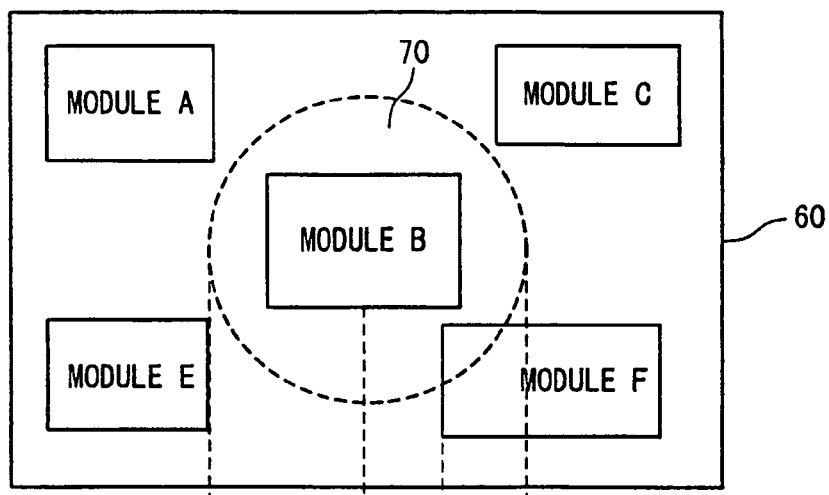
FIG. 10A is a diagram showing an IR drop improved amount according to the first embodiment of the present invention.
Figure 10B:
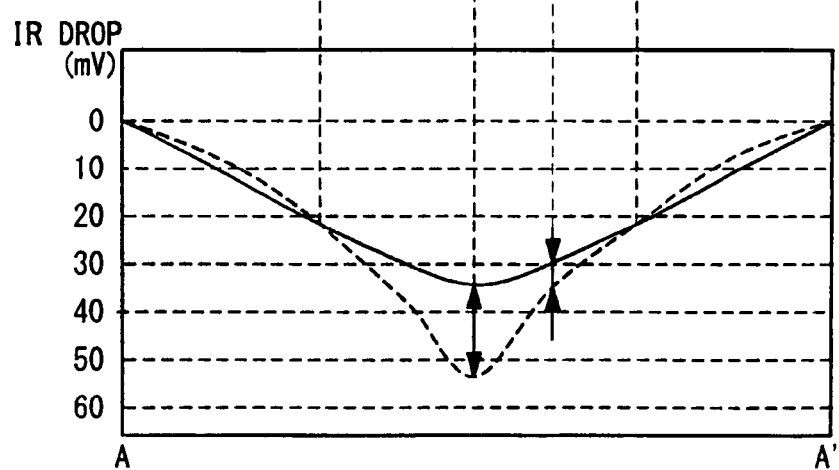
FIG. 10B is a diagram showing the IR drop amount in FIG. 10A.

For example, as shown in FIGS. 10A and 10B, when the module B and the module F are extracted as the over-permissible-amount modules, it is possible to determine a difference between the IR drop amount 42 and the permissible amount 41 of the modules B and F at a position according to the floor plan. This case reveals that the module B has a maximum IR drop amount at the center, which requires the IR drop improved amount of 20 mV, while the module F needs the IR drop improved amount of 5 mV.

The layout design supporting system of the present invention is provided with the dummy area table 46 for calculating a dummy area added to prevent that the IR drop amount exceeds the permissible amount. As shown in FIG. 11, the dummy area table 46 shows a size of the dummy area corresponding to a clock period and the IR drop improved amount. The dummy area table 46 is calculated at step S250 shown in FIG. 7. The dummy area table 46 is not generated in each product design, but is preferably produced before start of the layout design of the LSI.

Figure 12A:
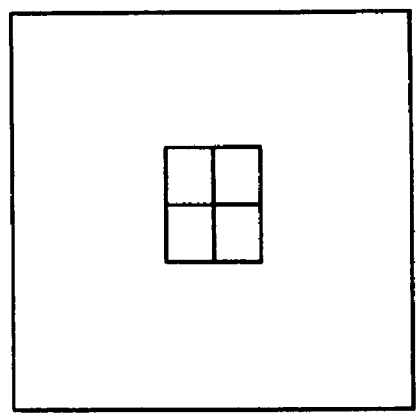
FIG. 12A is a diagram showing an example in which a basic model circuit is arranged in a power supply lattice according to the first embodiment of the present invention.

A calculation procedure of the dummy area table 46 (step S250) will be described in detail. First, an IR drop amount of a basic model circuit is calculated based on the basic model circuit data 33. The basic model circuit indicated by the basic model circuit data 33 is a circuit group for calculating the dummy area table 46. The IR drop amount is calculated for each clock frequency based on the power supply system data 34 including a power supply configuration, a power supply structure, wiring resistances and wiring capacitances of the power supply interconnections, when the basic model circuit is arranged in a power supply lattice of each process (step S252). FIG. 12A illustrates an example when the basic model circuit is arranged in the power supply lattice.

Figure 12B:
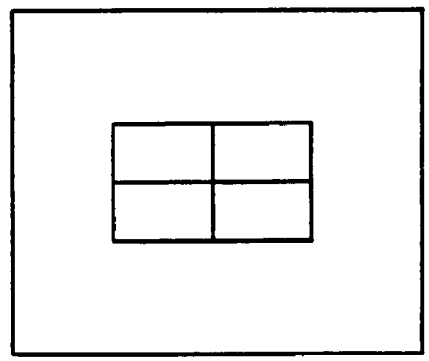
FIG. 12B is a diagram showing an example in which a basic model circuit with the dummy area is arranged in the power supply lattice according to the first embodiment of the present invention.

A dummy area of a predetermined amount Gx is added to every cell included in the basic model circuit data 33 (step S253). As shown in FIG. 12B, the basic model circuit is arranged whose cells are made larger in size. The IR drop amount is calculated for the cell added with the dummy area of the predetermined amount Gx (the dummy area added cell) (step S254).

Next, a coefficient indicating the size of the dummy area (a unit dummy area coefficient) is calculated based on these results. That is, assuming that the IR drop amount in case of only the basic model circuit calculated at step S252 is D0 and the IR drop amount in case of the basic model circuit of the cell added with the dummy area calculated at step S254 (the dummy area added cell) is D1, the IR drop amount D improved by adding the dummy area can be determined by D=(D0−D1). Also, assuming that the number of grids indicating the size of the basic model circuit is G0 and the number of grids indicating the size of the basic model circuit added with the dummy area is G1, the number of grids Gd indicating the size of the dummy area can be determined by Gd=(G1−G0). Therefore, the coefficient indicating the size of the dummy area required to improve the IR drop amount per basic unit (the unit dummy area coefficient) G can be determined as follows:

$$G = Gd/D = (G1-G0)/(D0-D1) \quad (1)$$

where when it is assumed that the unit of the IR drop amount is millivolt, the unit dummy area coefficient G indicates the size of the dummy area (grids) required to improve the IR drop amount for 1 millivolt.

Figure 13:
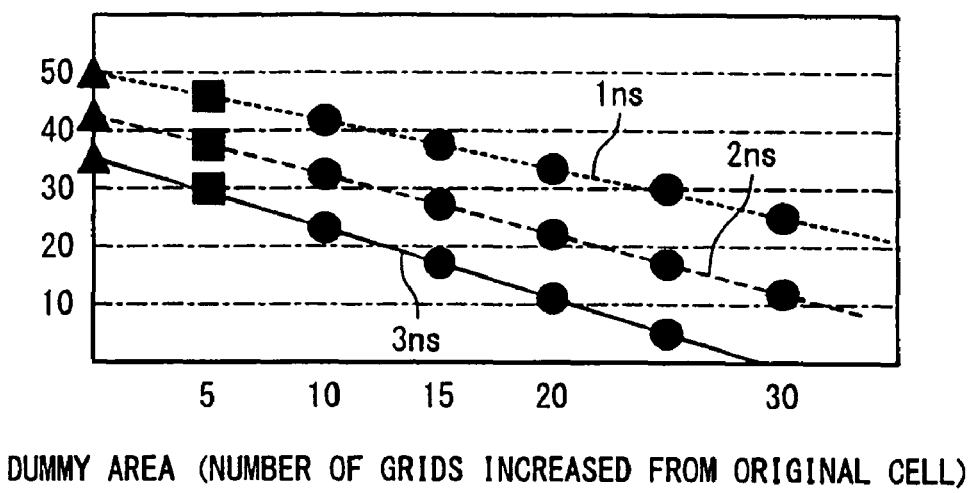
FIG. 13 is a diagram showing a relation between the size of the dummy area and the IR drop amount according to the first embodiment of the present invention.

The IR drop improved amount corresponding to the size of the dummy area can be calculated by dividing the size of the added dummy area by the unit dummy area coefficient G described above. Therefore, the relation between the size of the dummy area and the IR drop amount is plotted on a straight line for each clock period, as shown in FIG. 13. In FIG. 13, a horizontal axis represents the size of the added dummy area, and a vertical axis represents the IR drop amount. A black triangle (▲) represents the IR drop amount in case of only the model circuit. A black square (■) represents the IR drop amount calculated after the dummy area is added. A black circle (●) represents the determined result of the IR drop amount of the model circuit to which a dummy area is added using the unit dummy area coefficient G.

As shown in FIG. 11, the dummy area table 46 is calculated by multiplying the unit dummy area coefficient G determined for the clock period by the IR drop improved amount. The dummy area table 46 calculated in this manner is stored in the storage unit 15 via the network 16.

The dummy area table 46 calculated in this manner is referred to calculate a dummy area corresponding to the over-permissible-amount module (step S260). That is, the dummy area corresponding to the IR drop improved amount is added to the cell included in the over-permissible-amount module (the basic model circuit), thereby generating a virtual arrangement cell (a dummy area added cell) for the module.

Figures 14A, 14B:
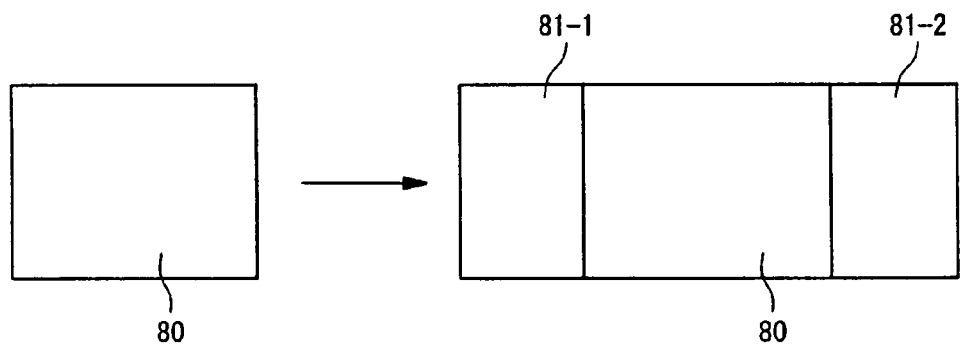
FIGS. 14A and 14B are diagram showing the position relation in arrangement between an original cell and dummy areas according to the first embodiment of the present invention.

As shown in FIGS. 14A and 14B, referring to the dummy area table 46, the dummy areas 81-1 and 81-2 corresponding to the IR drop improved amount 45 are added to a cell 80 (hereinafter to be referred to as an original cell) included in the over-permissible-amount module. FIG. 14A shows the original cell 80, and FIG. 14B shows the original cell 80 to which the dummy areas 81-1 and 81-2 are added. In the dummy area added cell shown in FIG. 14B, the original cell 80 is arranged between the dummy area 81-1 and the dummy area 81-2. The dummy area added cell generated based on a cell included in each over-permissible-amount module is stored into the virtual arrangement library 47 in the storage unit 15 (step S270).

As described above, when the virtual arrangement library 47 is produced (step S200), the cell in the netlist of the circuit data provided in the initial stage of the design is replaced with the dummy area added cell by referring to the virtual arrangement library 47 (FIG. 2: step S300). That is, the cell included in the over-permissible-amount module registered in the over-permissible-amount module data 43 is replaced with the dummy area added cell. This eliminates a possibility for the IR drop to exceed the permissible amount.

Figure 15:
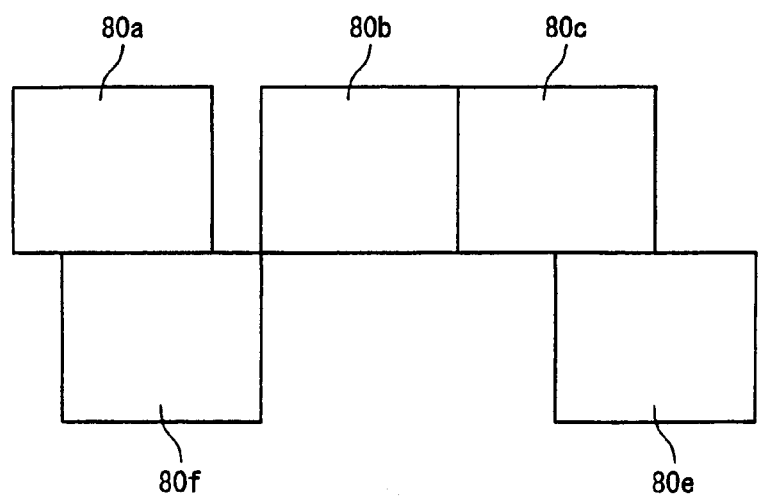
FIG. 15 is a diagram showing an example of arrangement of the original cell according to the first embodiment of the present invention.
Figure 16:
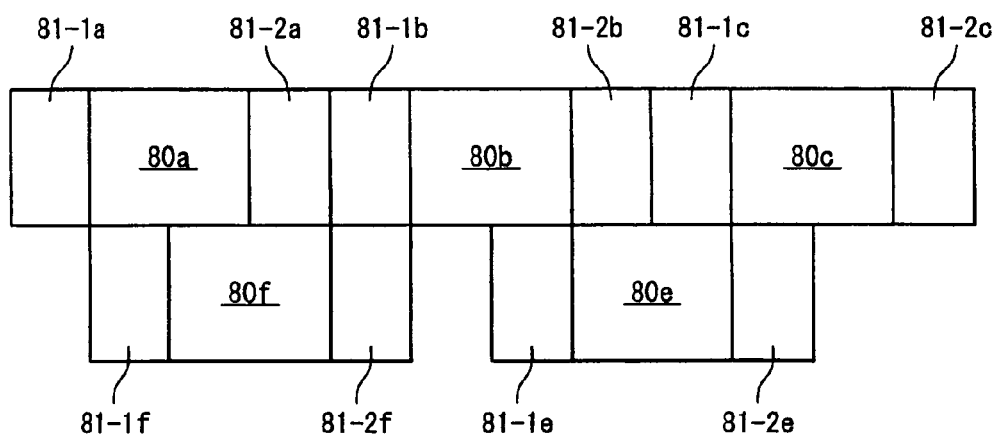
FIG. 16 is a diagram showing an example of arrangement using the virtual arrangement library according to the first embodiment of the present invention.

Next, the cell is automatically arranged by the arrangement tool based on the netlist in which a cell is replaced with the dummy area added cell (step S400). When the original cells 80a to 80c, 80e and 80f are used to carry out the automatic arrangement under an arrangement constraint condition set to avoid the IR drop, the original cells 80a, 80b and 80c are arranged adjacent to one another, as shown in FIG. 15. At this time, there is a possibility that the IR drop amount in that arrangement area exceeds the permissible amount. In contrast, according to the design method of the present invention, the arrangement tool uses the virtual arrangement library 47 to carry out the automatic arrangement. FIG. 16 shows a result thereof. The original cells 80a, 80b and 80c are arranged at intervals expanded by the added dummy areas 81-2a, 81-1b, 81-2b and 81-1c. The arrangement without IR drop is thus defined.

Figure 17:
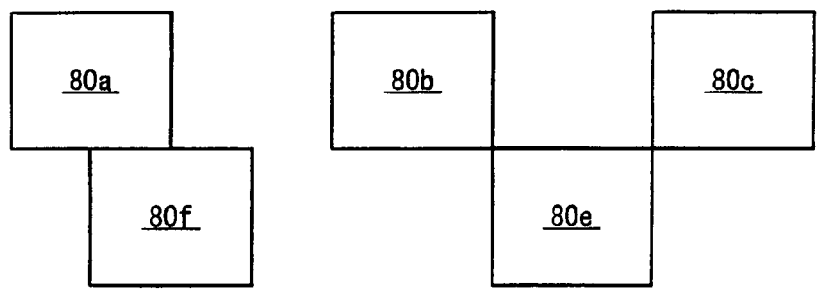
FIG. 17 is a diagram showing a result of the arrangement according to the first embodiment of the present invention.

When the automatic arrangement is completed, the dummy area added cell replaced based on the virtual arrangement library 47 is again replaced back to the original cell (the cell replacement: step S500). FIG. 17 shows the result thereof. That is, the dummy areas added to both sides of the original cell are deleted without shifting the position where the original cell is arranged. It is revealed that a density of the original cell decreases. The arrangement resultant data 48 is stored in the storage unit 15 of the server 14 via the network 16 to complete the cell arrangement.

Second Embodiment

Figure 18:
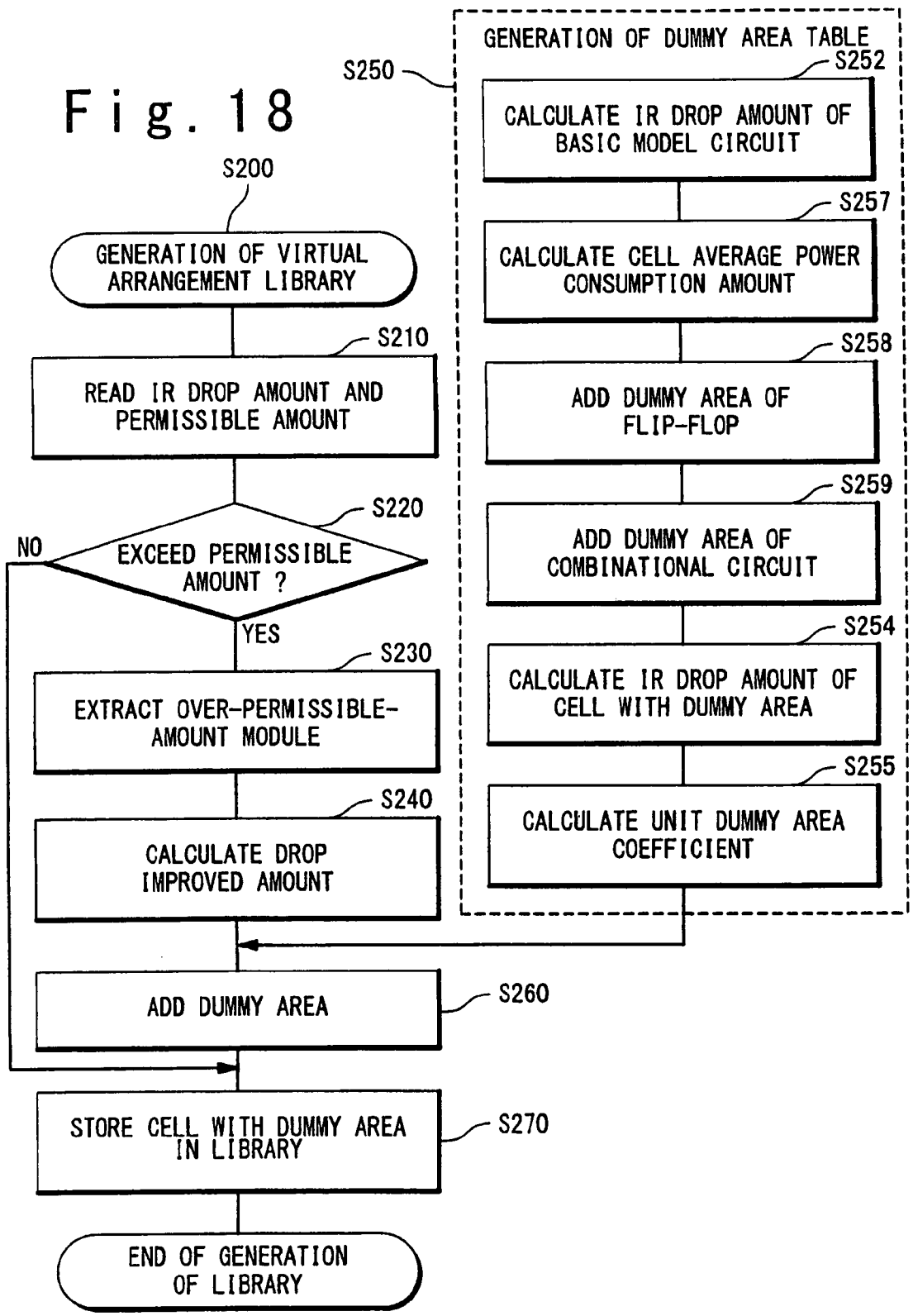
FIG. 18 is a flowchart showing a procedure to generate the virtual arrangement library according to a second embodiment of the present invention.

Next, the layout design supporting system according to a second embodiment of the present invention will be described. In the second embodiment, the system configuration and the operation except for the above step S250 are the same as those of the first embodiment, and therefore, the description thereof will be omitted. In this way, the Step S250 in the second embodiment will be described with reference to FIG. 18. As shown in FIG. 18, the step S250 in the second embodiment includes steps S257, S258 and S259 instead of the step S253 in the first embodiment.

In the step S250 of generating the dummy area table 46, the IR drop amount is calculated for each clock frequency based on the power supply system data 34 containing the power supply configuration, the power supply structure, interconnection resistances and interconnection capacitances of the power supply interconnections, when the basic model circuit is arranged in the power supply lattice of each process (step S252).

Subsequently, the basic model circuit is divided into a flip-flops and circuit elements other than the flip-flops (hereinafter to be referred to as a combinational circuit), and their respective power consumption amounts are calculated. Thus, it is provided an average value of the power consumption amounts for one toggling of the flip-flop (PFa), and an average value of the power consumption for one toggling of the combinational circuit (PCa) (step S257).

The average value of the cell power consumption amounts is calculated, and then the coefficient (the unit dummy area coefficient) is determined to indicate a size of the dummy area added to each flip-flop in the basic model circuit. The size of the dummy area is calculated based on a ratio of the average value of the power consumption amount for one toggling of the flip-flop (PFa) to the average value of the power consumption amount for one toggling of the combinational circuit (PCa). That is, the number of grids GFx indicating the size of the dummy area of each flip-flop is calculated as follows:

$$GFx=Gx\times PFa/(PFa+PCa) \quad (2)$$

by referring to the dummy areas of the predetermined amount Gx added to all the above-mentioned cells. For example, when the increase of grids Gx is 20 grids, the average power consumption amount of the flip-flop PFa is 16 mW, and the average power consumption amount of the combinational circuit PCa is 4 mW, the size of the dummy area of the flip-flop; GFx=20×16/(16+4)=16 grids. The 16-grid dummy area is added to each flip-flop (step S258).

Likewise, the size of the dummy area for the combinational circuit is determined in the same way (step S259). More specifically, the size of the dummy area of the combinational circuit is calculated based on a ratio of the average value of the power consumption amount for one toggling of the combinational circuit (PCa) to the average value of the power consumption amount for one toggling of the flip-flop (PFa). The number of grids GCx indicating the size of the dummy area of each combinational circuit is calculated as follows:

$$GCx=Gx\times PCa/(PCa+PFa) \quad (3)$$

by referring to a dummy area of the predetermined amount Gx. For example, when the increase of grids Gx is 20 grids, the average power consumption amount of the flip-flop PFa is 16 mW, and the average power consumption amount of the combinational circuit PCa is 4 mW, here is the size of the dummy area of the combinational circuit GCx=20×4/(4+16)=4 grids. The 4-grid dummy area is added to each combinational circuit (step S258).

When the size of the dummy area is determined to be added to each cell, the IR drop amount of the basic model circuit in the cell added with the dummy area is calculated (step S254). The subsequent operation is same as that of the first embodiment, and thus the description thereof is omitted.

As described above, since the amount of dummy area to be added is set separately to the flip-flop and the combinational circuit, it is possible to reduce the time for timing convergence and the arrangement area.

This is based on a fact that the flip-flop intends to have a cell size and average power consumption amount larger than those of the combinational circuit. In the flip-flop and the combinational circuit whose power consumption amount differ from each other, the difference in the number of grids caused between the dummy areas to be added makes it possible to make the dummy area larger for the flip-flop that consumes high power on average, and to make the dummy area smaller for the combinational circuit that average power consumption amount is low. This prevents the IR drop amount from exceeding the permissible amount, and the cell of the combinational circuit using many cells is allowed to be arranged in proximity. As a result, this offers the effect of reducing the convergence time and the arrangement area.

Third Embodiment

Figure 19:
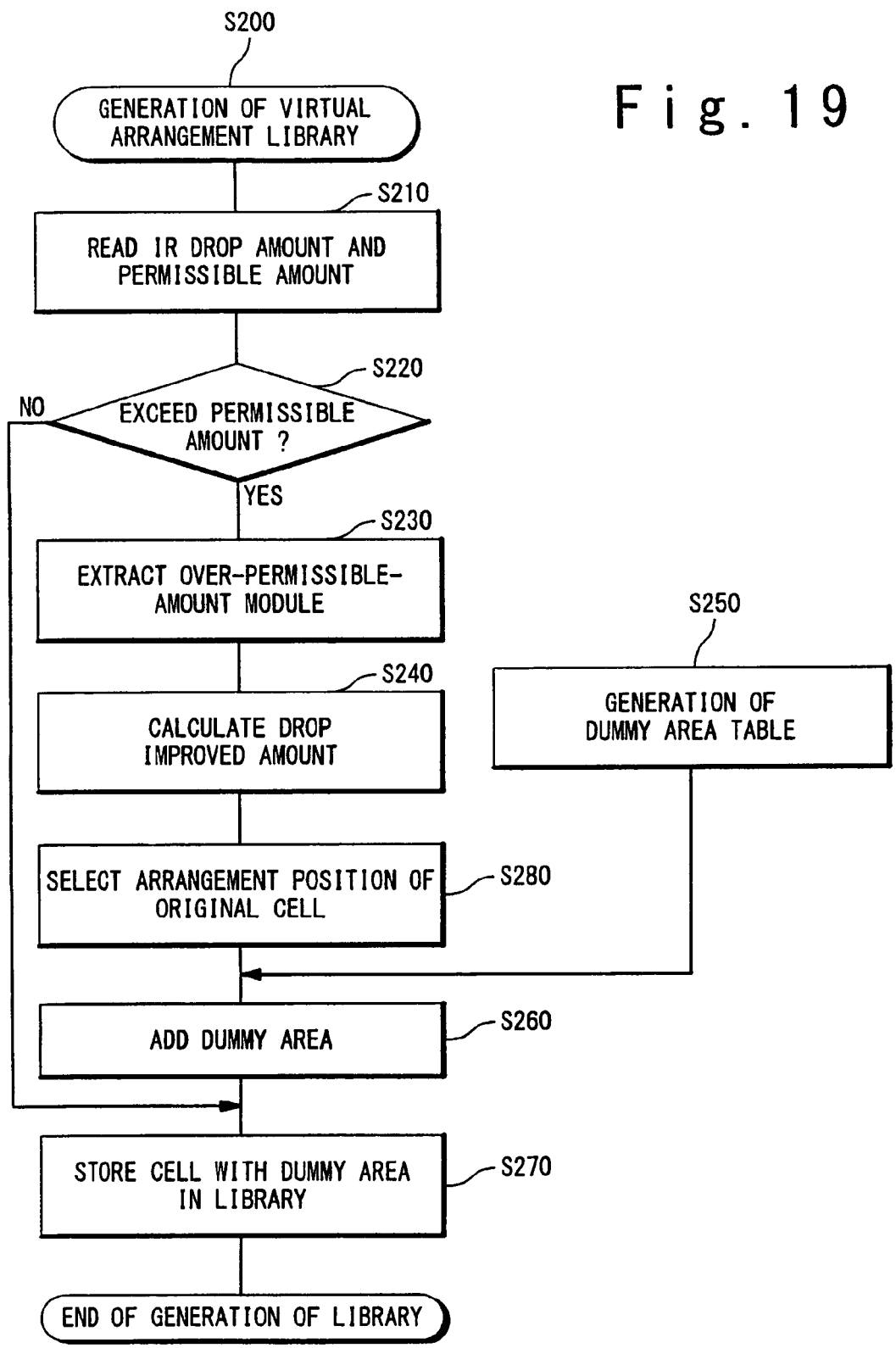
FIG. 19 is a flowchart showing a procedure to generate the virtual arrangement library according to a third embodiment of the present invention.

A third embodiment of the present invention will be described below. In the third embodiment, the system configuration and the operation except for a process for generating the virtual arrangement library (step S200) are same as those of the first embodiment. Thus, the description thereof will be omitted. As shown in FIG. 19, the process of generating the virtual arrangement library (step S200) in the third embodiment includes an additional step S280 compared to step S200 in the first embodiment (refer to FIG. 7).

In the process of generating the virtual arrangement library (step S200), the IR drop amount and the permissible amount of each location is received (step S210). For extracting a module having a dummy area added cell, it is determined whether there is any position where the IR drop amount exceeds the permissible amount (step S220). If there is no position where the IR drop amount exceeds the permissible amount (step S220-NO), an automatic arrangement and wiring is performed based on a cell being used normally. If there is a position where the IR drop amount exceeds the permissible amount (step S220-YES), the module at that position (the over-permissible-amount module) is extracted (step S230). When the over-permissible-amount module is extracted, the IR drop improved amount of such a module is calculated (step S240).

Figure 20:
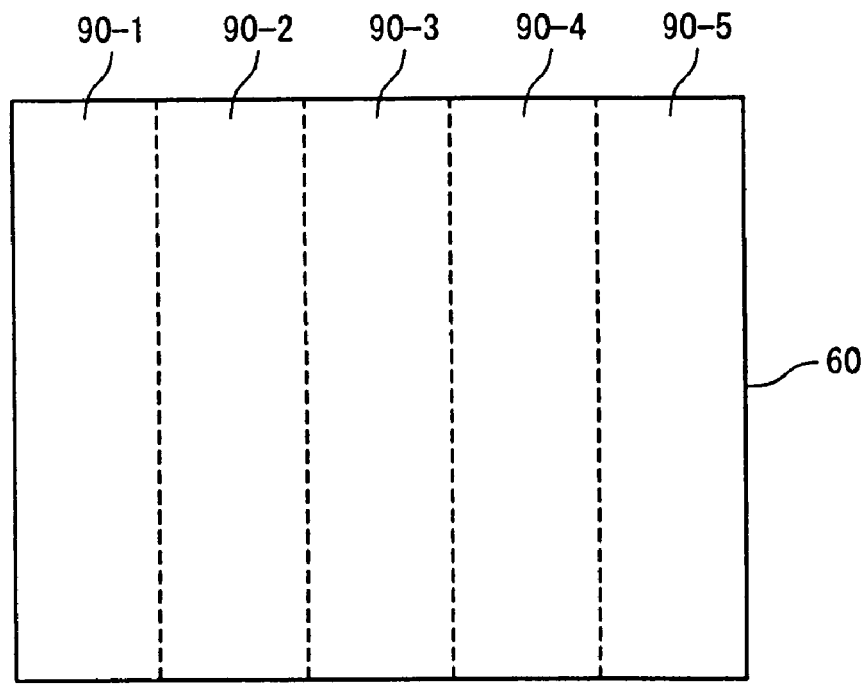
FIG. 20 is a diagram showing an example of division of an arrangement area according to the third embodiment of the present invention.

Then, the positional relation is set between the dummy area and an original cell (step S280). This determines a positional relation between the original cell included in the module and the dummy area depending on an arrangement of the module on the LSI. An area on the LSI 160 where the module is arranged is thus divided into five areas 90-1 to 90-5, for example, as shown in FIG. 20. The positional relation in the arrangement between the original cell included in the module and the dummy area is determined in association with the area where the module is allotted.

The area 90-1 is between a left side of the LSI 60 and a line on a position of 20% from the left side. The area 90-2 is between the line on the position of 20% from the left side and a line on the position of 40% from the left side. The area 90-3 is a central area of the LSI 60, i.e., is between the line on the position of 40% from the left side and a line on the position of 60% from the left side (40% from the right side). The area 90-4 is between the line on the position of 60% from the left side (40% from the right side) and a line on a position of 80% from the left side (20% from the right side). The area 90-5 is between the line indicating the position of 80% from the left side (20% from the right side) and the right side, i.e., is between the right side and the line indicating the position of 20% from the right side.

Figure 21:
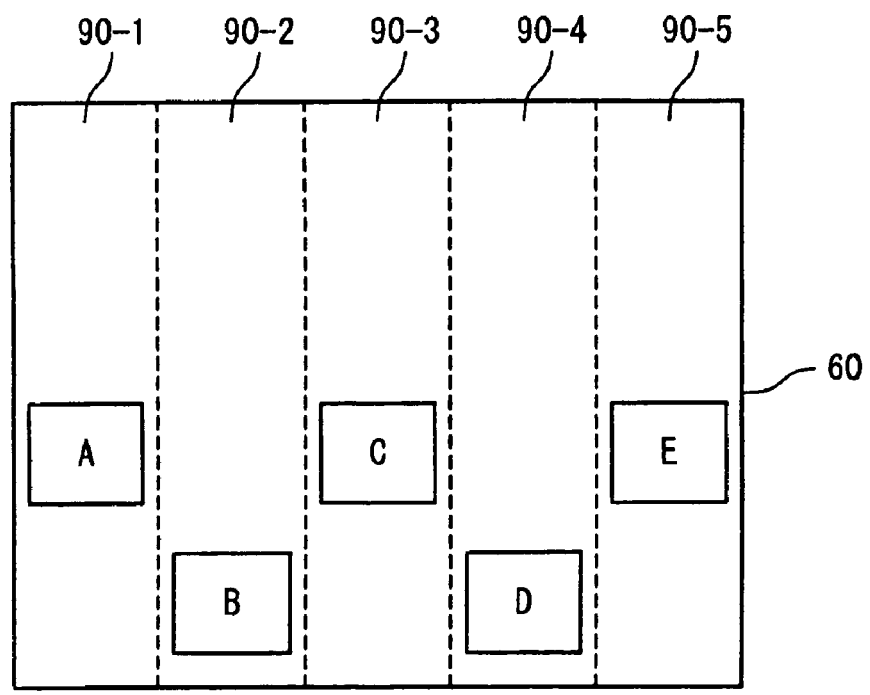
FIG. 21 is a diagram showing an example of arrangement of modules according to the third embodiment of the present invention.
Figure 22C:
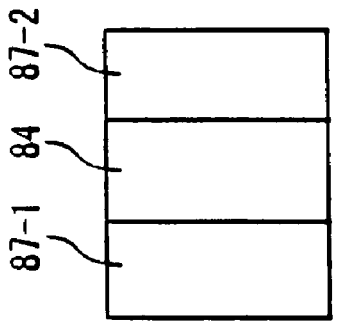
FIGS. 22A to 22E are diagrams showing the position relation between an original cell and a dummy area according to the third embodiment of the present invention.
Figure 22B:
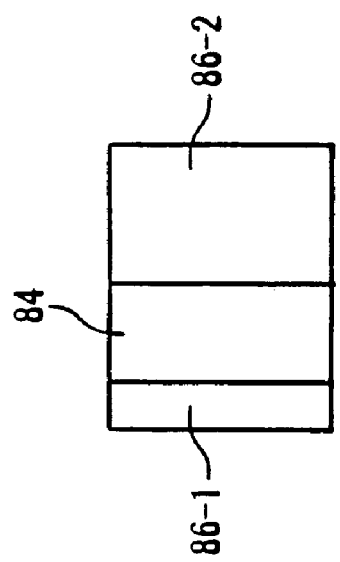
Figure 22A:
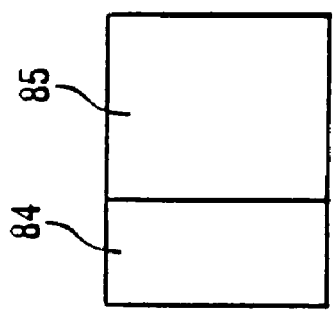
Figure 22D:
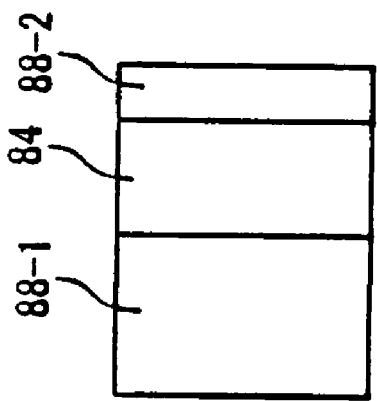
Figure 22E:
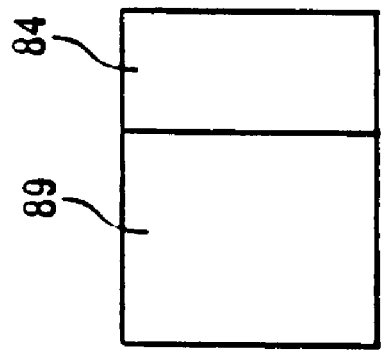

For example, as shown in FIG. 21, the modules A to E are allotted to the areas 90-1 to 90-5, respectively. It is supposed that the area containing sides closer to the left and right sides of the LSI 60 of the left and right sides of each module is the area where the module is allotted. In a dummy area added cell included in the module A allotted to the area 90-1, an arrangement position is determined so that the original cell 84 is arranged at a left end of the dummy area added cell, and the dummy area 85 is arranged on the right thereof, as shown in FIG. 22A. In a dummy area added cell included in the module B allotted to the area 90-2, an arrangement position is determined so that the original cell 84 is arranged employing a position of the line for 20% from a left side of the dummy area added cell as a position of a left side of the original cell 84, and the dummy area 86-1 is arranged on a left side thereof and the dummy area 86-2 is arranged on the right side thereof, as shown in FIG. 22B. In a dummy area added cell included in the module C allotted to the area 90-3, an arrangement position is determined so that the original cell 84 is arranged at the center of the dummy area added cell, and the dummy areas 87-1 and 87-2 each having a same size are arranged on the both sides of the original cell 84, as shown in FIG. 22C. In a dummy area added cell of the module D allotted to the area 90-4, an arrangement position is determined so that the original cell 84 is arranged employing the line at position of 20% from a right side of the dummy area added cell as a position of a right side of the original cell 84, and the dummy area 88-1 is arranged on a left side thereof and the dummy area 88-2 is arranged on a right side thereof, as shown in FIG. 22D. In the dummy area added cell of the module E allotted to the area 90-5, an arrangement position is determined so that the original cell 84 is arranged at a right end of the dummy area added cell, and the dummy area 89 is arranged on a left side thereof, as shown in FIG. 22E.

As described above, the arrangement position of the original cell in the dummy area added cell included in the module is changed, depending on the position on the LSI 60 to which the module is allotted, and thus a distribution of the IR drop amounts can be moved to the periphery of the LSI.

The positional relation between the original cell and the dummy area is determined, and a dummy area is calculated in association with an extracted over-permissible-amount module by referring to the dummy area table 46 (step S260). More specifically, a dummy area corresponding to the IR drop improved amount of the module is added to the cell included in the over-permissible-amount module (the basic model circuit), thereby generating a virtual arrangement cell for the module. The data on the generated dummy area added cell is stored in the virtual arrangement library 47 (step S270).

Although the area is divided into five in this case, the number of divided areas is not limited to five and the area size may be uneven. Further, when the module is allotted at a position of X % from a left side (or a right side), the original cell may be arranged at the position of X %. Moreover, in FIGS. 20 to 22E, the power supply interconnection and the ground interconnection are arranged to extend in a horizontal direction, and the dummy area is provided in the horizontal direction of the original cell. Therefore, when the power supply interconnection and the ground interconnection are in the multiple directions, the arrangement is also performed in various directions.

Fourth Embodiment

Figure 23:
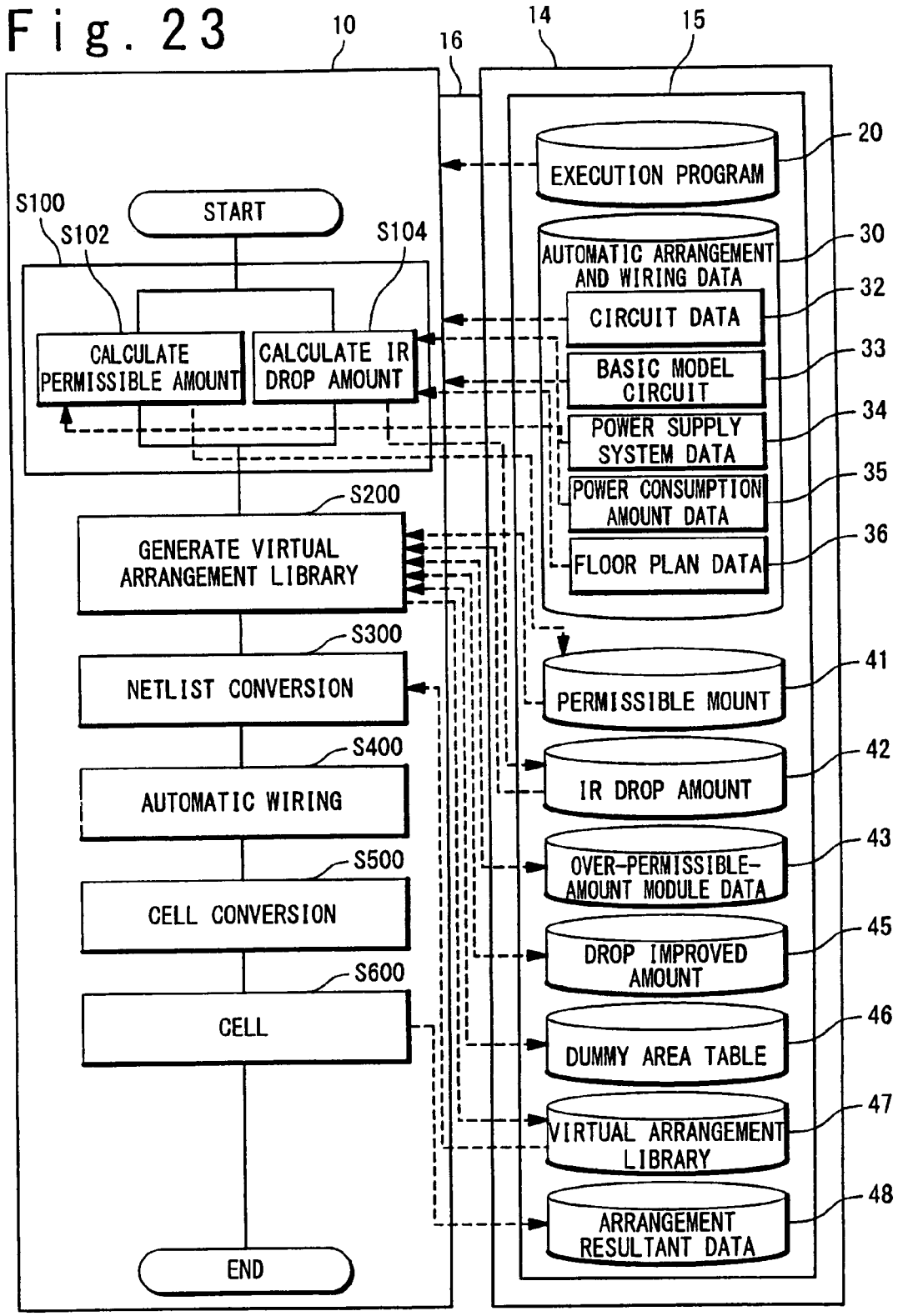
FIG. 23 is a diagram showing a configuration and operation of a layout design supporting system according to a fourth embodiment of the present invention.

Next, the layout design supporting system according to a fourth embodiment of the present invention will be described below. The fourth embodiment has the same system configuration as in the first embodiment. The layout design supporting operation in the fourth embodiment is different from that of the first embodiment, in that an additional process of arranging capacitive fill cells (step S600) after the conversion of the cell (step S500) in the first embodiment, as shown in FIG. 23. Here, the fill cell is a cell that will be able to function as a block by changing a wiring layer, such as an NAND circuit, an NOR circuit, and a flip-flop.

Figure 24:
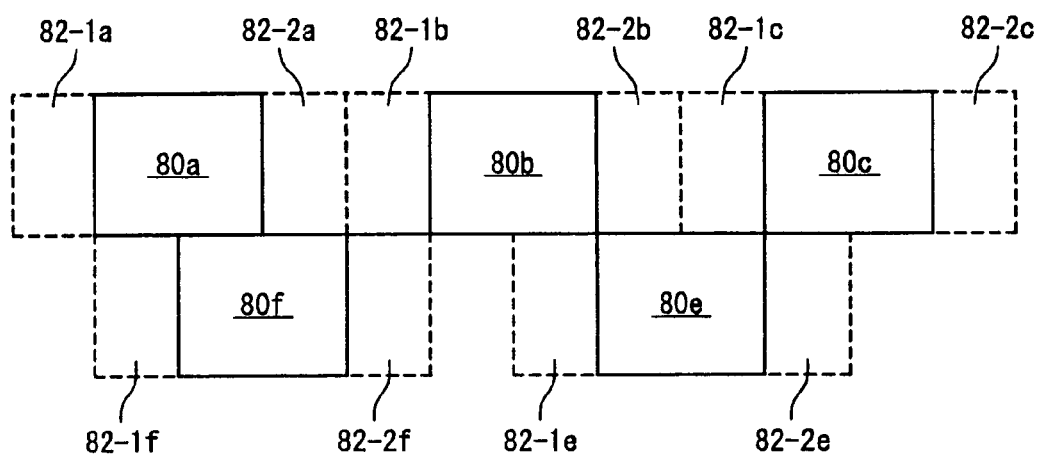
FIG. 24 is a diagram showing an example in which a capacitive fill cell is arranged according to the fourth embodiment of the present invention.

In the first embodiment, the cell in the virtual arrangement library 47 is replaced back to the original cell to complete the layout design. In the fourth embodiment, the cell in the virtual arrangement library 47 is replaced back to the original cell (step S500), and then a capacitive fill cell is arranged (step S600). The capacitive fill cell is arranged in an area where are the dummy area of the cells in the virtual arrangement library 47. Therefore, as described in the first embodiment (to refer to as FIG. 16), the dummy area 81 (a symbol "-" and the numeral posterior thereto are omitted) is arranged, and then a portion of the dummy area 81 is replaced with the capacitive fill cell 82 (the symbol "-" and the numeral posterior thereto are omitted), as shown in FIG. 24.

In this manner, in the fourth embodiment, the capacitive fill cell is automatically arranged in the dummy area arranged by using the virtual arrangement library 47. The IR drop amount can be suppressed, thereby reducing a power supply line noise.

Fifth Embodiment

Figure 25:
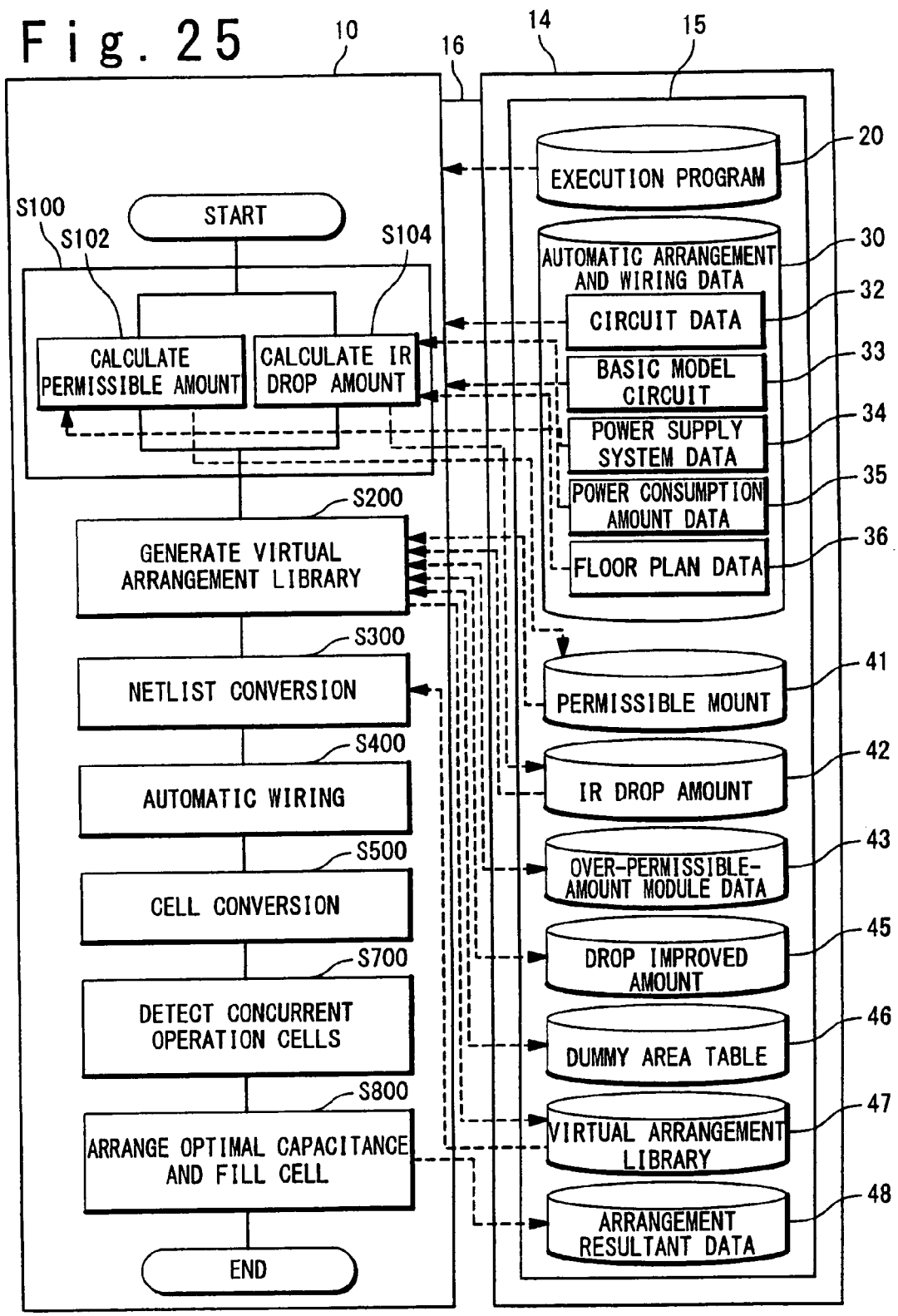
FIG. 25 is a diagram showing a configuration and operation of a layout design supporting system according to a fifth embodiment of the present invention.

A fifth embodiment will be described below. In the fifth embodiment, a further measure is taken to the cells operating simultaneously. The fifth embodiment includes the same system configuration as that of the first embodiment. Therefore, the description thereof will be omitted. Compared to the first embodiment, a method of supporting a layout design of a semiconductor integrated circuit according to the fifth embodiment additionally includes a processes of detecting the cells operating simultaneously (step S700) and a process of arranging an optimal capacitive fill cell (step S800) after the conversion of the cell (step S500) in the first embodiment, as shown in FIG. 25. Here, the additional processes will be described.

As shown in FIG. 25, the cell in the virtual arrangement library 47 is replaced back to the original cell (step S500), and cells operating simultaneously are detected based on timing data contained in the circuit data 32 (step S700).

For cells operating simultaneously in synchronism with a clock signal, an optimal decoupling capacitance value is calculated based on the clock period. The optimal decoupling capacitance value is calculated for the cells operating simultaneously, and then the capacitive fill cell is arranged in the vicinity of the cells operating simultaneously based on the decoupling capacitance value. For the cells other than the cells operating simultaneously, the capacitive fill cell having a same capacitance value is arranged in the vicinity of such cells to ensure the uniformity (step S800).

Figure 26:
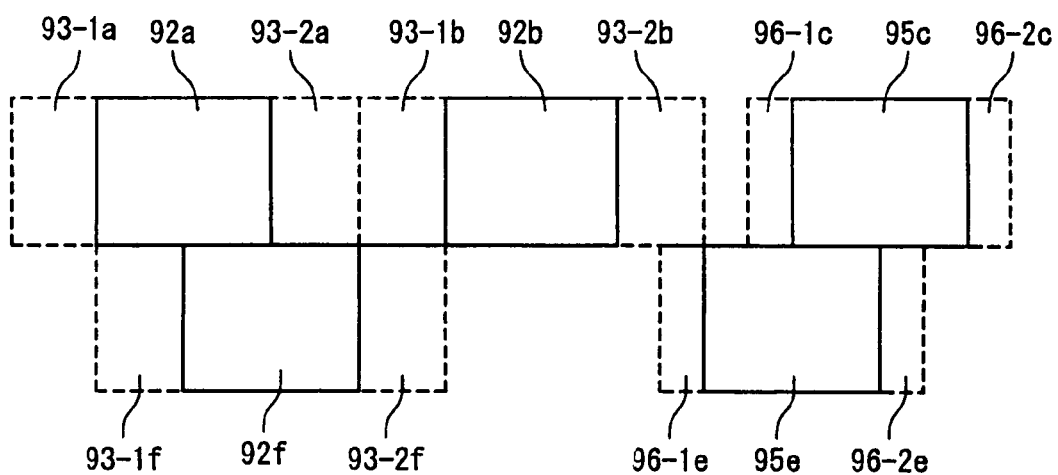
FIG. 26 shows an example in which a capacitive fill cell having an optimal capacitance value is arranged according to the fifth embodiment of the present invention.

As a result, the capacitive fill cells 93-1a, 93-2a, 93-1b, 93-2b, 93-1f and 93-2f, each of which has the decoupling capacitance value calculated as the optimal capacitance value, are arranged in the vicinity of the original cells 92a, 92b and 92f operating simultaneously, as shown in FIG. 26. The capacitive fill cells 96-1c, 96-2c, 96-1e and 96-2e having the same capacitance values are arranged in the vicinity of the original cells 95c and 95e not operating simultaneously to ensure the uniformity.

In this manner, since the optimal decoupling capacitance is automatically arranged in the vicinity of the cell operating simultaneously, the power supply line noise generated due to the simultaneous operation can be reduced, thereby a malfunction due to local IR drop can be prevented.

As described above, in the present invention, a virtual arrangement library provided with the optimal area where the IR drop amount does not exceed the permissible amount is produced from the circuit data (the netlist, the module data, the clock data and the operating frequency), the basic model circuit, the floor plan data, the power supply configuration, the power supply structure, and the interconnection resistances and interconnection capacitances of the power supply interconnections. The virtual arrangement library is applied to the arrangement tool, and thus the cell arrangement can be performed so as to satisfy the permissible amount without depending on the arrangement tool.

Further, according to the present invention, timing convergence due to the IR drop amount is improved, and thus the designs can be performed in which the timing is considered, and no iteration occurs between the arrangement step and the step of confirming the permissible amount.

Furthermore, the arrangement tool has an arrangement algorithm that differs from for every arrangement constraints. Therefore, the different tool causes a variation in the arrangement result even under the same arrangement constraints. In contrast, according to the present invention, the virtual arrangement library applied to the arrangement tool can achieve the cell arrangement that suppresses and controls the IR drop amount without depending on the arrangement tool.

Moreover, since the virtual arrangement library with the optimally sized dummy area is produced for each layout design, it is not required to prepare the library corresponding to all clock periods, the power supply structure, and the IR drop amount. Therefore, only a small database capacity is required for the library.

Also, according to the present invention, the characteristics of the circuit elements used in the circuits are extracted, and the virtual arrangement library in which the dummy area to be added is variable is produced based on the extracted characteristics. Therefore, it is possible to shorten the time for convergence and to make the arrangement area small. In addition, the present invention can utilize the tendency in which the IR drop amount is small on the periphery of the LSI, while being increased concentrically toward the center. The arrangement of the dummy area is adjusted for the cell used in the periphery of the LSI and the cell used at the center of the LSI. Thus, a number of cells can be arranged on the periphery of the LSI where the IR drop amount is larger, and the expansion of the permissible amount of IR drop at the center of the LSI can be achieved as well as the permissible amount of IR drop is satisfied with a smaller arrangement area.

Further, after arranging the cells to which the measures for the IR drop have been taken, a decoupling capacitance is automatically inserted between the cells, to reduce the power supply line noise while expanding the permissible amount of IR drop. In addition, the optimal decoupling capacitance is automatically inserted into a position where the IR drop is strict, so that the power supply line noise can be reduced. Also, a variation in the IR drop can be reduced, thereby preventing a malfunction due to the local IR drop.

As described above, the virtual arrangement library with the optimal area which the IR drop amount does not exceed the permissible amount is produced based on the circuit data including the netlist, the module data, the clock data and the data on the operation frequency, the power supply system data including the data on the power supply configuration, the power supply structure, the interconnection resistance and interconnection capacity of the power supply interconnection, the basic model circuit data, the power consumption amount data, and the floor plan data. The layout design is executed by use of the arrangement tool based on the virtual arrangement library, so that the cells can be arranged to satisfy the IR drop permissible amount. In should be noted that the design methods described in the first to fifth embodiments described above can be executed in combination in a range where no inconsistent arises.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A layout design method of a semiconductor integrated circuit, the layout design method comprising:
   calculating an IR drop data indicating a voltage drop for a plurality of local areas;
   generating a virtual arrangement library which stores data of a circuit cell to be arranged based on said IR drop data for a plurality of circuit modules;
   generating a virtual arrangement net list by converting said circuit cell contained in a net list into a virtual arrangement cell which is registered on said virtual arrangement library;
   automatically arranging a circuit module of said plurality of circuit modules based on said virtual arrangement net list; and
   replacing said virtual arrangement cell contained in the circuit module having been automatically arranged with said circuit cell contained in said net list.

2. The layout design method according to claim 1, wherein said calculating the IR drop data comprises:
   calculating an IR drop amount indicating a voltage drop amount in a local area of the plurality of local areas based on circuit data, basic model circuit data, floor plan data, power supply system data and power supply interconnection data; and calculating a permissible amount of IR drop corresponding to the voltage drop amount in said local area that is under a supposition that a circuit is uniformly distributed.

3. The layout design method according to claim 1, wherein said calculating an IR drop data comprises:
calculating a permissible amount corresponding to the voltage drop amount in said local area under supposition that a circuit is uniformly distributed, based on power supply interconnection data; and
calculating an IR drop amount indicating a voltage drop amount in said local area based on power consumption amount data indicating a power consumption amount for every circuit module of the plurality of circuit modules, and floor plan data indicating data of an outlined arrangement of said circuit module.

4. The layout design method according to claim 2, wherein said generating the virtual arrangement library comprises:
generating data of a dummy area added cell, in which an arrangement area of said circuit cell is extended for a dummy area such that said IR drop amount in said local area does not exceed said permissible amount of IR drop in said local area.

5. The layout design method according to claim 4, wherein said generating the virtual arrangement library comprises:
extracting said circuit module which is arranged in a local area of in which said IR drop amount exceeds said permissible amount of IR drop; and
generating data of said dummy area added cell obtained by extending said circuit cell contained in the extracted circuit module.

6. The layout design method according to claim 4, wherein said replacing comprises:
replacing said dummy area of said dummy area added cell with a capacitance fill cell as a functional block with a change of a wiring layer.

7. The layout design method according to claim 6, wherein said replacing with said capacitance fill cell comprises:
extracting a plurality of circuit cells including the circuit cell which operate at a same time;
calculating an optimal capacitance of said capacitance fill cell to be added to the plurality of circuit cells having been extracted, based on a period operating at the same time; and
arranging the capacitance fill cell with the optimal capacitance in said dummy area to be added each circuit cell of the plurality of circuit cells having been extracted.

8. The layout design method according to claim 5, wherein said generating the virtual arrangement library comprises:
calculating for every circuit module of the plurality of circuit modules, a drop improved amount indicating a portion of said IR drop amount exceeding said permissible amount in the local area in which the extracted circuit module is arranged; and
determining a size of said dummy area based on said drop improved amount by referring to a dummy area table which stores a coefficient for said dummy area in relation to said drop improved amount.

9. The layout design method according to claim 8, wherein said generating the dummy area table comprises:
calculating a basic model IR drop amount which comprises an IR drop amount of a previously prepared basic model circuit cell;
calculating a dummy area added cell IR drop amount which comprises said IR drop amount of a cell obtained by adding said dummy area of a predetermined size to a basic model circuit cell; and calculating said coefficient based on said basic model IR drop amount and said dummy area added cell IR drop amount.

10. The layout design method according to claim 8, wherein said generating the virtual arrangement library further comprises:
setting a positional relationship of said dummy area and an original cell to which said dummy area is added.

11. The layout design method according to claim 10, wherein said setting the arrangement comprises:
setting the arrangement relationship of said dummy area added cell and said original cell based on the local area of said circuit module.

12. The layout design method according to claim 9, wherein said calculating the coefficient comprises:
calculating a coefficient corresponding to a clock frequency by changing a clock frequency when said basic model circuit cell operates.

13. The layout design method according to claim 12, wherein said generating a dummy area table comprises:
calculating an average power consumption amount for all of the basic model circuit cell;
classifying said basic model circuit cell into a flip-flop circuit cell and a combinational circuit cell which excludes the flip-flop circuit cell and calculating the average power consumption amount of each of the flip-flop circuit cell, and the combinational circuit cell;
calculating a coefficient for determining said dummy area to be added to the flip-flop circuit cell, based on an average power consumption amount of all of the basic model circuit cell, the average power consumption amount of said flip-flop circuit cell and the average power consumption amount of said combinational circuit cell.

14. A non-transitory computer-readable storage medium tangibility embodying a program of machine-readable instructions executable by a digital processing apparatus to perform a layout design method of a semiconductor integrated circuit, wherein said layout design method comprises:
calculating an IR drop data indicating a voltage drop for a plurality of local areas;
generating a virtual arrangement library which stores data of a circuit cell to be arranged based on said IR drop data for a plurality of circuit modules;
generating a virtual arrangement net list by converting said circuit cell contained in a net list into a virtual arrangement cell which is registered on said virtual arrangement library;
automatically arranging a circuit module of said plurality of circuit modules based on said virtual arrangement net list; and
replacing said virtual arrangement cell contained in the circuit module having been automatically arranged with said circuit cell contained in said net list.

15. A layout design supporting apparatus for a semiconductor integrated circuit, comprising:
an IR drop data calculating section configured to calculate an IR drop data indicating a voltage drop for every local area of the plurality of local areas;
a virtual arrangement library generating section configured to generate a virtual arrangement library which stores data of a circuit cell to be arranged based on said IR drop data, for a plurality of circuit modules;
a net list converting section configured to change said circuit cell contained in a net list into a virtual arrangement cell registered on said virtual arrangement library and to generate an virtual arrangement net list;

an automatically arranging section configured to automatically arrange a circuit module of the plurality of circuit modules based on said virtual arrangement net list; and a net list reversely converting section configured to replace said virtual arrangement cell contained in the circuit module having been automatically arranged with said circuit cell contained in said net list.

16. The layout design supporting apparatus according to claim 15, wherein said IR drop data calculating section comprises:

an IR drop amount calculating section configured to calculate an IR drop amount indicating a voltage drop amount in a local area of the plurality of local areas based on circuit data, basic model circuit data, floor plan data, power supply system data and power supply interconnection data; and a permissible amount calculating section configured to calculate a permissible IR drop amount corresponding to the voltage drop amount in the local area that is under a supposition that a circuit is uniformly distributed.

17. The layout design supporting apparatus according to claim 15, wherein said IR drop data calculating section comprises:

a permissible amount calculating section configured to calculate a permissible IR drop amount corresponding to a voltage drop amount in a local area of the plurality of local areas that is under a supposition that a circuit is uniformly distributed, based on power supply interconnection data; and an IR drop amount calculating section configured to calculate an IR drop amount indicating a voltage drop amount in said local area based on power consumption amount data indicating a power consumption amount for every circuit module of the plurality of circuit modules and floor plan data indicating data of outlined arrangement of said circuit module.

18. The layout design supporting apparatus according to claim 16, wherein said virtual arrangement library generating section generates data of a dummy area added cell, in which an arrangement area of said circuit cell is extended for a dummy area such that said IR drop amount in said local area does not exceed said permissible amount in said local area, to register on said virtual arrangement library.

19. The layout design supporting apparatus according to claim 18, wherein said virtual arrangement library generating section extracts said circuit module which is arranged in a local area in which said IR drop amount exceeds said permissible IR drop amount, and generates and registers the data of said dummy area added cell obtained by extending said circuit cell contained in the extracted circuit module on said virtual arrangement library.

20. The layout design supporting apparatus according to claim 18, further comprising:

a capacitance fill cell arranging section configured to replace said dummy area of said dummy area added cell with a capacitance fill cell as a functional, block through change of a wiring layer.

21. The layout design supporting apparatus according to claim 20, wherein said capacitance fill cell arranging section calculates an optimal capacitance of said capacitance fill cell to be added to a plurality of circuit cells including the circuit cell, which operate simultaneously based on a period operating at a same time.

22. The layout design supporting apparatus according to claim 19, wherein said virtual arrangement library generating section calculates for every circuit module of the plurality of circuit modules, a drop improved amount indicating a portion of said IR drop amount exceeding said permissible IR drop amount in the local area in which the extracted circuit module is arranged, and determines a size of said dummy area based on said drop improved amount by referring to a dummy area table which stores a coefficient for said dummy area in relation to said drop improved amount.

23. The layout design supporting apparatus according to claim 22, further comprising:

a dummy area table generating section configured to generate said dummy area table, wherein said dummy area table generating section calculates a basic model IR drop amount which comprises an IR drop amount of a previously prepared basic model circuit cell, calculates a dummy area added cell IR drop amount which comprises said IR drop amount of a circuit cell obtained by adding said dummy area of a predetermined size to said basic model circuit cell, and calculates said coefficient based on said basic model IR drop amount and said dummy area added cell IR drop amount.

24. The layout design supporting apparatus according to claim 22, wherein said virtual arrangement library generating section sets a positional relationship of said dummy area and an original cell to which said dummy area is added.

25. The layout design supporting apparatus according to claim 24, wherein said virtual arrangement library generating section sets the positional relationship of said dummy area and said original cell based on a position where said circuit module is arranged.

26. The layout design supporting apparatus according to claim 23, wherein said dummy area table generating section calculates the coefficient corresponding to a clock frequency by changing a clock frequency when said basic model circuit cell operates.

27. The layout design supporting apparatus according to claim 26, wherein said dummy area table generating section:

calculates an average power consumption amount for all of the basic model circuit cell;

classifies said basic model circuit cell into a flip-flop circuit cell and a combinational circuit cell, which excludes the flip-flop circuit cell and calculates an average power consumption amount of each of the flip-flop circuit cell and the combinational circuit cell; and calculates said coefficient for determining said dummy area to be added to the flip-flop circuit cell, based on an average power consumption amount of all of the basic model circuit cell, an average power consumption amount of said flip-flop circuit cell and an average power consumption amount of said combinational circuit cell.

* * * * *